US006991710B2

(12) United States Patent
Harris et al.

(10) Patent No.: US 6,991,710 B2
(45) Date of Patent: Jan. 31, 2006

(54) APPARATUS FOR MANUALLY AND AUTOMATICALLY PROCESSING MICROELECTRONIC WORKPIECES

(75) Inventors: Randy Harris, Kalispell, MT (US); Daniel J. Woodruff, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 62 days.

(21) Appl. No.: 10/080,914

(22) Filed: Feb. 22, 2002

(65) Prior Publication Data

US 2003/0159277 A1    Aug. 28, 2003

(51) Int. Cl.
*C25D 19/00* (2006.01)
(52) U.S. Cl. .................. 204/198; 118/729; 118/500; 134/902; 156/345.51; 204/212; 204/224 R; 204/224 M; 204/269; 414/222.13; 414/935
(58) Field of Classification Search ............... 204/198
See application file for complete search history.

(56) References Cited

U.S. PATENT DOCUMENTS

| | | |
|---|---|---|
| 1,526,644 A | 2/1925 | Phinney |
| 1,881,713 A | 10/1932 | Laukel |
| 2,256,274 A | 9/1941 | Boedecker et al. |
| 2,966,915 A | 1/1961 | Rochefort |
| 3,573,186 A | 3/1971 | Ryerson et al. |
| 3,878,066 A | 4/1975 | Dettke et al. |
| 3,904,493 A | 9/1975 | Losi et al. |
| 4,046,105 A | 9/1977 | Gomez |
| 4,055,751 A | 10/1977 | Bussmann et al. |
| 4,090,926 A | 5/1978 | Matson |
| 4,132,605 A | 1/1979 | Tench et al. |
| 4,146,437 A | 3/1979 | O-Keefe |
| 4,155,815 A | 5/1979 | Francis et al. |
| 4,304,641 A | 12/1981 | Grandia et al. |
| 4,404,078 A | 9/1983 | Francis |
| 4,451,197 A | 5/1984 | Lange |
| 4,495,453 A | 1/1985 | Inaba et al. |
| 4,539,090 A | 9/1985 | Francis |
| 4,566,847 A | 1/1986 | Maeda et al. |

(Continued)

FOREIGN PATENT DOCUMENTS

| | | |
|---|---|---|
| WO | WO 99/46065 | 9/1999 |
| WO | WO 99/47731 | 9/1999 |
| WO | WO 99/57549 | 11/1999 |

(Continued)

OTHER PUBLICATIONS

International Search Report for International Application No. PCT/US03/05063; Applicant: Semitool, Inc.; Date Mailed: Aug. 8, 2003; 5 pgs.

(Continued)

*Primary Examiner*—Roy King
*Assistant Examiner*—William T. Leader
(74) *Attorney, Agent, or Firm*—Perkins Coie LLP (57) ABSTRACT

A method and apparatus for manually and automatically processing microelectronic workpieces. The apparatus can include a tool having a plurality of processing stations, all of which are manually accessible to a user, and an input/output station configured to support at least one microelectronic workpiece for automatic transfer to and from the processing stations. A transfer device is positioned proximate to the input/output station and the processing stations and is configured to automatically transfer microelectronic workpieces between the input/output station and the processing stations. The apparatus can be used for both manual and automatic processing of microelectronic workpieces, either sequentially or simultaneously.

15 Claims, 7 Drawing Sheets

U.S. PATENT DOCUMENTS

| | | | |
|---|---|---|---|
| 4,568,234 A | 2/1986 | Lee et al. | |
| 4,634,503 A | 1/1987 | Nogavich | |
| 4,639,028 A | 1/1987 | Olson | |
| 4,648,944 A | 3/1987 | George et al. | |
| 4,670,126 A | 6/1987 | Messer et al. | |
| 4,760,671 A | 8/1988 | Ward | |
| 4,761,214 A | 8/1988 | Hinman | |
| 4,770,590 A | 9/1988 | Hughes et al. | |
| 4,828,654 A | 5/1989 | Reed | |
| 4,902,398 A | 2/1990 | Homstad | |
| 4,917,774 A | 4/1990 | Fisher | |
| 4,917,777 A | 4/1990 | Fisher | |
| 4,944,650 A | 7/1990 | Masumoto | |
| 4,948,473 A | 8/1990 | Phillippi | |
| 4,949,671 A | 8/1990 | Davis et al. | |
| 4,988,533 A | 1/1991 | Freeman et al. | |
| 5,000,827 A | 3/1991 | Schuster et al. | |
| 5,061,144 A | 10/1991 | Akimoto et al. | |
| 5,064,337 A | 11/1991 | Asakawa et al. | |
| 5,135,636 A | 8/1992 | Yee et al. | |
| 5,138,973 A | 8/1992 | Davis et al. | |
| 5,156,174 A | 10/1992 | Thompson et al. | |
| 5,156,730 A | 10/1992 | Bhatt et al. | |
| 5,168,886 A | 12/1992 | Thompson et al. | |
| 5,178,512 A | 1/1993 | Skrobak | |
| 5,192,403 A | 3/1993 | Chang et al. | |
| 5,196,096 A | 3/1993 | Chang et al. | |
| 5,217,586 A | 6/1993 | Datta et al. | |
| 5,222,310 A | 6/1993 | Thompson et al. | |
| 5,223,118 A | 6/1993 | Sonneberg et al. | |
| 5,227,041 A | 7/1993 | Brogden et al. | |
| 5,232,328 A | 8/1993 | Owczarz et al. | |
| 5,234,573 A | 8/1993 | Takami | |
| 5,256,274 A | 10/1993 | Poris | |
| 5,314,294 A | 5/1994 | Taniguchi et al. | |
| 5,344,491 A | 9/1994 | Katou | |
| 5,364,510 A | 11/1994 | Carpio | |
| 5,368,711 A | 11/1994 | Poris | |
| 5,372,293 A * | 12/1994 | Corlay et al. | 118/423 X |
| 5,376,176 A | 12/1994 | Kuriyama | |
| 5,377,708 A | 1/1995 | Bergman et al. | |
| 5,378,145 A | 1/1995 | Ono et al. | |
| 5,389,215 A | 2/1995 | Horiuchi et al. | |
| 5,391,271 A | 2/1995 | Ludwig | |
| 5,442,416 A | 8/1995 | Tateyama et al. | |
| 5,460,478 A | 10/1995 | Akimoto et al. | |
| 5,509,772 A * | 4/1996 | Doche | 414/217 |
| 5,534,128 A | 7/1996 | Aso et al. | |
| 5,544,421 A | 8/1996 | Thompson et al. | |
| 5,571,325 A | 11/1996 | Ueyama et al. | |
| 5,584,310 A | 12/1996 | Bergman et al. | |
| 5,639,206 A | 6/1997 | Oda et al. | |
| 5,658,387 A | 8/1997 | Reardon et al. | |
| 5,670,034 A | 9/1997 | Lowery | |
| 5,681,392 A | 10/1997 | Swain | |
| 5,684,713 A | 11/1997 | Asada et al. | |
| 5,700,127 A | 12/1997 | Harada et al. | |
| 5,711,646 A | 1/1998 | Ueda et al. | |
| 5,723,028 A | 3/1998 | Poris | |
| 5,731,678 A | 3/1998 | Zila et al. | |
| 5,746,565 A | 5/1998 | Tepolt | |
| 5,754,842 A | 5/1998 | Minagawa | |
| 5,759,006 A | 6/1998 | Miyamoto et al. | |
| 5,765,444 A | 6/1998 | Bacchi et al. | |
| 5,765,889 A | 6/1998 | Nam et al. | |
| 5,785,826 A | 7/1998 | Greenspan | |
| 5,980,706 A | 11/1999 | Bleck et al. | |
| 5,985,126 A | 11/1999 | Bleck et al. | |
| 5,989,397 A | 11/1999 | Laube et al. | |
| 5,999,886 A | 12/1999 | Martin et al. | |
| 6,004,828 A | 12/1999 | Hanson | |
| 6,027,631 A | 2/2000 | Broadbent | |
| 6,028,986 A | 2/2000 | Song | |
| 6,053,687 A | 4/2000 | Kirkpatrick et al. | |
| 6,074,544 A | 6/2000 | Reid et al. | |
| 6,080,291 A | 6/2000 | Woodruff et al. | |
| 6,080,691 A | 6/2000 | Lindsay et al. | |
| 6,090,260 A | 7/2000 | Inoue et al. | |
| 6,091,498 A | 7/2000 | Hanson et al. | |
| 6,110,011 A | 8/2000 | Somekh et al. | |
| 6,110,346 A | 8/2000 | Reid et al. | |
| 6,136,163 A | 10/2000 | Cheung et al. | |
| 6,139,712 A | 10/2000 | Patton et al. | |
| 6,151,532 A | 11/2000 | Barone et al. | |
| 6,156,167 A | 12/2000 | Patton et al. | |
| 6,159,354 A | 12/2000 | Contolini et al. | |
| 6,162,344 A | 12/2000 | Reid et al. | |
| 6,162,488 A | 12/2000 | Gevelber et al. | |
| 6,168,695 B1 | 1/2001 | Woodruff et al. | |
| 6,179,983 B1 | 1/2001 | Reid et al. | |
| 6,193,859 B1 | 2/2001 | Contolini et al. | |
| 6,199,301 B1 | 3/2001 | Wallace | |
| 6,228,232 B1 | 5/2001 | Woodruff et al. | |
| 6,234,738 B1 | 5/2001 | Kimata et al. | |
| 6,264,752 B1 | 7/2001 | Curtis et al. | |
| 6,270,647 B1 | 8/2001 | Graham et al. | |
| 6,280,583 B1 | 8/2001 | Woodruff et al. | |
| 6,288,561 B1 * | 9/2001 | Leedy | 324/760 |
| 6,303,010 B1 | 10/2001 | Woodruff et al. | |
| 6,309,520 B1 | 10/2001 | Woodruff et al. | |
| 6,309,524 B1 | 10/2001 | Woodruff et al. | |
| 6,318,951 B1 * | 11/2001 | Schmidt et al. | 414/744.5 |
| 6,322,677 B1 | 11/2001 | Woodruff et al. | |
| 6,391,166 B1 | 5/2002 | Wang | |
| 6,471,913 B1 | 10/2002 | Weaver et al. | |
| 6,569,297 B2 | 5/2003 | Wilson et al. | |
| 6,716,330 B2 | 4/2004 | Hongo et al. | |
| 2001/0032788 A1 | 10/2001 | Woodruff et al. | |
| 2001/0043856 A1 | 11/2001 | Woodruff et al. | |
| 2002/0008037 A1 | 1/2002 | Wilson et al. | |
| 2002/0032499 A1 | 3/2002 | Wilson et al. | |
| 2002/0084195 A1 | 7/2002 | Chen et al. | |
| 2002/0096508 A1 | 7/2002 | Weaver et al. | |
| 2002/0102156 A1 | 8/2002 | Woodruff et al. | |
| 2002/0125141 A1 | 9/2002 | Wilson et al. | |
| 2002/0139678 A1 | 10/2002 | Wilson et al. | |
| 2003/0127337 A1 | 7/2003 | Hanson et al. | |
| 2003/0141185 A1 | 7/2003 | Wilson et al. | |
| 2003/0159277 A1 | 8/2003 | Harris et al. | |
| 2003/0159921 A1 | 8/2003 | Harris et al. | |

FOREIGN PATENT DOCUMENTS

| | | |
|---|---|---|
| WO | WO 00/02675 | 1/2000 |
| WO | WO 00/02808 | 1/2000 |
| WO | WO 00/61498 | 10/2000 |
| WO | WO 00/61837 | 10/2000 |
| WO | WO 01/90434 | 11/2001 |
| WO | WO 02/04886 | 1/2002 |
| WO | WO 01/099165 | 12/2002 |
| WO | WO 02/097165 | 12/2002 |

OTHER PUBLICATIONS

Lowenheim, F.A., "Electroplating," (1978) McGray-Hill book Co., New York, pp 120-121.

Willard, Hobart H. et al., "Instrumental Methods of Analysis," (1974), pp 647-656, D. Van Nostrand Company.

U.S. Appl. No. 09/679,928, filed Oct. 5, 2000, Woodruff et al.

U.S. Appl. No. 60/129,055, filed Apr. 13, 1999, McHugh.

U.S. Appl. No. 60/143,769, filed Jul. 12, 1999, McHugh.

U.S. Appl. No. 60/182,160, filed Feb. 14, 2000, McHugh et al.

U.S. Appl. No. 60/206,663, filed May 24, 2000, Wilson et al.

Lee, Tien-Yu Tom et al., "Application of a CFD Tool in Designing a Fountain Plating Cell for Uniform Bump Plating of Semiconductor Wafers," IEEE Transactions On Components, Packaging and Manufacturing Technology—Part B, Feb 1996, pp 131-137, vol. 19, No. 1, IEEE.

Magnum, "The perfect partnership of process excellence and production control in a fully-automated platform," (1996), pp 1-12, Semitool, Inc.

Ritter, G., et al., "Two-And Three-Dimensional Numerical Modeling of Copper Electroplating for Advanced ULSI Metallization," Jun. 1999, 13 pgs, E-MRS Conference Symposium M. *Basics Models to Enhance Reliability*, Strasbourg, France.

* cited by examiner

APPARATUS FOR MANUALLY AND AUTOMATICALLY PROCESSING MICROELECTRONIC WORKPIECES

CROSS-REFERENCE TO RELATED APPLICATIONS

The present application relates to the following applications, all of which are incorporated herein by reference.

1. U.S. patent application Ser. No. 10/080,915, titled APPARATUS WITH PROCESSING STATIONS FOR MANUALLY AND AUTOMATICALLY PROCESSING MICROELECTRONIC WORKPIECES;

2. U.S. patent application Ser. No. 09/875,300 titled TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES filed Jun. 5, 2001;

3. U.S. patent application Ser. No. 10/080,910, titled MICROELECTRONIC WORKPIECE TRANSFER DEVICES AND METHODS OF USING SUCH DEVICES IN THE PROCESSING OF MICROELECTRONIC WORKPIECES, now U.S. Pat. No. 6,749,391; and 4. Published PCT Application No. PCT/US99/14414 titled AUTOMATED SEMICONDUCTOR PROCESSING SYSTEM filed Jun. 25, 1999.

TECHNICAL FIELD

The present invention is directed generally to methods and apparatuses for manually and automatically processing microelectronic workpieces.

BACKGROUND

Microelectronic devices, such as semiconductor devices and field emission displays, are generally fabricated on and/or in microelectronic workpieces using several different types of machines ("tools"). Many such processing machines have a single processing station that performs one or more procedures on the workpieces. An example of one such tool is a single-chamber Equinox tool available from Semitool, Inc. of Kalispell, Mont. This tool can have a shelf on which a container of microelectronic workpieces is positioned, and a single processing chamber for electrochemically processing the workpieces. A user can manually load the workpieces one by one into the chamber, for example, to test or demonstrate processing recipes or other processing parameters.

While the foregoing tool is useful in the engineering environment, production level processing requires greater throughput than can be provided by a single-chamber tool. Accordingly, other processing machines have a plurality of processing stations that can perform a series of different procedures on individual workpieces or batches of workpieces. For example, the LT210C and Spectrum tools, also available from Semitool, Inc., provide automated processing in a batch and single-wafer environment, respectively. These tools include robots that automatically remove the microelectronic workpieces from a container, move the microelectronic workpieces among the relevant processing stations, and return the microelectronic workpieces to the container after processing. While such tools are very effective for processing large volumes of microelectronic workpieces, they may not be cost-effective or practical when used in an engineering, test or demonstration environment.

One problem with the foregoing tools is that they typically require a clean room environment in which to operate. Clean rooms are expensive to build and maintain, and accordingly tool manufacturers attempt to maximize the number of microelectronic workpieces processed per hour per square foot of clean room area occupied by the tool. However, despite efforts to make tools as compact and efficient as possible, there is continual pressure to reduce the size of the tool (e.g. the "footprint" of the tool) and increase the efficiency of the tool. This pressure becomes all the more intense when device manufacturers require both engineering/test and production processing capabilities, which in turn requires even more clean room area.

SUMMARY

The present invention is directed toward apparatuses and methods for processing microelectronic workpieces. One aspect of several embodiments of the invention is a single processing tool that can be suitable for both manual and automatic operation. By combining these functions in a single tool, limited clean room area can be more fully utilized. Furthermore, by integrating some or all of the tool with a gray room environment, the space occupied by the tool in a clean room can be reduced. Therefore, tools in accordance with several embodiments of the invention can increase the utilization of valuable clean room space by providing both engineering and production level processing capabilities in a single, low-footprint device.

In one embodiment, the processing tool can include one or more processing stations, each of which can be accessed by an automatic transfer device (for automatically transferring microelectronic workpieces to and/or from the processing station) and by a user (for manually transferring the microelectronic workpieces). The manual operation can occur sequentially or simultaneously with the automatic operation. For example, the tool can include a plurality of processing stations, with all the processing stations of the tool being manually accessible to a user to manually load microelectronic workpieces for processing. The tool can further include an input/output station configured to support at least one microelectronic workpiece for automatic transfer to and from the processing stations. A transfer device is positioned proximate to the input/output station and the processing stations to automatically transfer microelectronic workpieces between the input/output station and the processing stations in lieu of or in conjunction with manual manipulation of workpieces in the tool.

The tool can include a shield positioned proximate to the transfer device to at least restrict access to the transfer device by the user when the user manually accesses the processing stations. In one aspect of the invention, a support that carries the microelectronic workpieces into the processing station can be positioned above the shield for manual operation and below the shield for automatic operation. The support can be carried from a position above the processing station and can be removed relative to the processing station and/or removed from the tool along a support holder, such as a pair of rails. Access to the interior of the tool can be provided exclusively by access panels in oppositely facing front and rear surfaces of the tool. This can allow the tool to have a smaller effective footprint and integrate with both a clean room environment and a gray room environment. The foregoing arrangements are expected to make the tool more compact, more versatile to use, and easier to service.

In a more particular embodiment, the processing station can include a processing vessel configured to provide a processing fluid, and a support movably positioned proximate to the processing vessel and configured to carry the microelectronic workpiece. The support can be movable between a process position, a first transferring position spaced apart from the process position, and a second transferring position spaced apart from the first transferring position. The support is oriented to contact the microelectronic substrate with the processing fluid when in the process position, and is oriented to receive the microelectronic workpiece from the transfer device when in the first transferring position. The support is configured to receive the microelectronic workpiece manually from the user when in the second transferring position. The support can be supported from above and can move away from the processing station along a guide path to allow access to the processing station.

DETAILED DESCRIPTION

The following description discloses the details and features of several embodiments of apparatuses for processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1–8.

Figure 1:
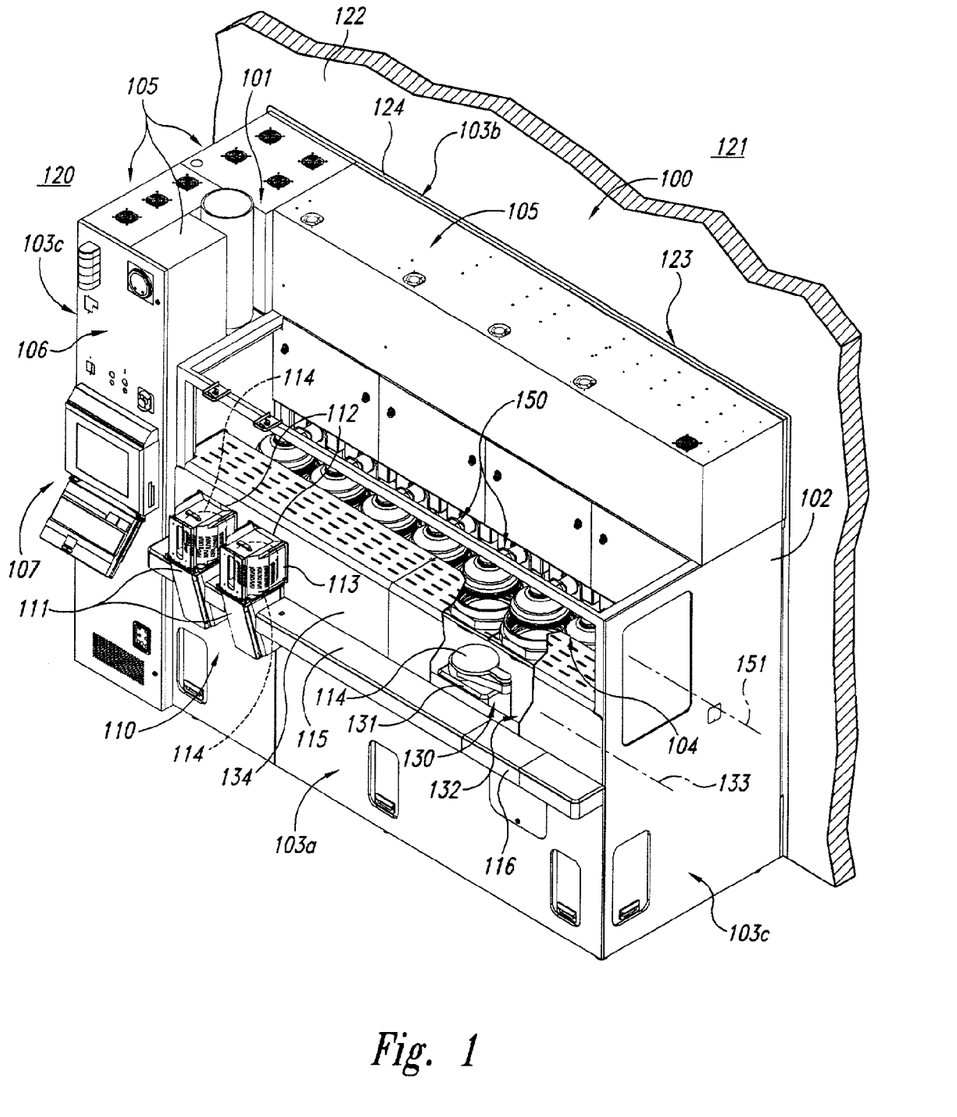
FIG. 1 is a partially cutaway, isometric view of an apparatus configured to both manually and automatically process microelectronic workpieces in accordance with an embodiment of the invention.

FIG. 1 is a partially cutaway isometric view of an apparatus 100 configured to both manually and automatically process microelectronic workpieces in accordance with an embodiment of the invention. In one aspect of this embodiment, the apparatus 100 can be used in both a research and development setting and a production setting. For example, in a research and development setting, individual microelectronic workpieces can be moved manually into and out of the apparatus 100 for experimenting with and demonstrating new methods and processes. The same apparatus 100 can be used in a production setting in which large numbers of microelectronic workpieces are automatically and efficiently moved into and out of the apparatus in a routine manner for processing. As described in greater detail below, the manual and automated processes can occur sequentially or simultaneously using a single apparatus 100.

In one aspect of this embodiment, the apparatus 100 can include a chassis 101 carrying a plurality of processing stations 150. The chassis 101 can carry eight processing stations 150 as shown in FIG. 1, or alternatively, the chassis 101 can carry other numbers of processing stations 150 in other embodiments. The processing stations 150 can be aligned along a station axis 151 which, in one embodiment, can be generally straight. In alternate embodiments, the station axis 151 can be curved (for example, in a horseshoe shape) or can have other shapes. In any of these embodiments, microelectronic workpieces 114 can be loaded manually and/or automatically into the processing stations 150 depending upon the requirements for a particular station 150 at a particular point in time.

The apparatus 100 can include an enclosure 102 disposed around some or all of the chassis 101 and the processing stations 150. The enclosure 102 can have a plurality of surfaces, such as a front surface 103a, a rear surface 103b facing opposite from the front surface 103a, and two side surfaces 103c between the front surface 103a and the rear surface 103b. The front surface 103a can be configured to face the user (not shown) and can include a graphical user interface 107 coupled to a processor 106 to control the operation of electrical units 105. The electrical units 105 in turn power and control the components of the apparatus 100.

The front surface 103a can also include an input/output station 110 configured to support the microelectronic workpieces 114 for automatic transfer into and out of the processing stations 150. In one aspect of this embodiment, the input/output station can include two tilting platforms 111, each configured to support a container 113 that removably carries a plurality of the microelectronic workpieces 114. The tilting platforms 111 can be moved from an outwardly tilted position (for receiving the containers 113) to an upright position (shown in FIG. 1). When the containers 113 are in the upright position, the microelectronic workpieces 114 within the containers 113 are accessible to an automated transfer device 130 through container access openings 112 in the enclosure 102.

The automated transfer device 130 can include a robot 131 supported by a transfer device support 132. The robot 131 can move along a transfer device guide path 133 to remove the microelectronic workpieces 114 from the containers 113 and move the microelectronic workpieces 114 through the container access opening 112, into the enclosure 102 and to the processing stations 150. The transfer device 130 can then return the microelectronic workpieces 114 to the same or a different container 113 through the same or a different access opening 112.

The front surface 103a can also include a support surface 115 on which the containers 113 can be positioned for manual loading and unloading. In one aspect of this embodiment, the support surface 115 can have a removable section 116 that allows for service access to the transfer device 130. Alternatively, the transfer device 130 can be accessed from other portions of the apparatus 100. In either embodiment, the user can place the containers 113 on the support surface 115 and then individually remove the microelectronic workpieces 114 from the container 113 and move them into the enclosure 102 through a manual access opening 104. Accordingly, in one aspect of this embodiment, the manual access opening 104 can be large enough to allow the user to manually access any and all of the processing stations 150. In a further aspect of this embodiment, the manual access opening 104 can be a single, contiguous opening. Alternatively, the manual access opening 104 can include a plurality of smaller adjacent openings separated, for example, by vertical dividers that still allow the user to access all the processing stations 150. In any of these embodiments, the manual access opening 104 can be positioned on a single side (such as the front side) of the apparatus 100 so that the user can manually access all the processing stations 150 from one side of the apparatus 100.

In another aspect of this embodiment, the manual access opening 104 can be permanent. Alternatively, the apparatus 100 can include a panel that can be positioned over the manual access opening 104 to fully enclose the processing stations 150 and the transfer device 130, for example, during extended periods of exclusively automated processing. In a further aspect of this alternate embodiment, the enclosure 102 can define a "mini" clean room environment. In any of these embodiments, a shield 134 can be positioned adjacent to the transfer device 130 to prevent interference between the transfer device 130 and the user when the user manually accesses the processing stations 150, as described in greater detail below with reference to FIG. 2.

The rear surface 103b of the enclosure 102 faces opposite the front surface 103a and can provide service access to the components within the enclosure 102. For example, the processing stations 150 and associated electrical, mechanical, and chemical systems can be accessed from service access openings (not visible in FIG. 1) in the rear surface 103b. In one aspect of this embodiment, service access to the apparatus 100 can be provided exclusively via the front surface 103a and the rear surface 103b. Accordingly, the side surfaces 103c need not have service access panels and need not be accessible for service after the apparatus 100 is installed. One feature of this embodiment is that the effective footprint of the apparatus 100 can be reduced compared with some conventional tools because, for example, the apparatus 100 does not require access aisles along the side surfaces 103c of the enclosure 102.

In another embodiment, the apparatus 100 can be positioned in a clean room environment 120 that is adjacent to a gray room environment 121. For example, the gray room environment 121 can include a room separated from the clean room environment 120 by a wall 122 and can define a generally clean environment that need not meet clean room standards. The wall 122 can include an aperture 123, and the rear surface 103b of the enclosure 102 can be placed adjacent to the aperture 123 with the front surface 103a and the side surfaces 103c projecting into the clean room environment 120. A seal 124 can be disposed around the periphery of the enclosure 102 at the aperture 123 to maintain the separation between the clean room environment 120 and the gray room environment 121. This arrangement can have several advantages. For example, the effective footprint of the apparatus 100 can be reduced when compared with conventional arrangements because an aisle need not be provided in the clean room environment 120 adjacent to the rear surface 103b. When service is performed on the apparatus 100, most of the internal components of the apparatus 100 can be accessed from the gray room environment 121 through the access openings in the rear surface 103b. Accordingly, many service functions can be provided without requiring service personnel to enter the clean room environment 120, which entails the time consuming process of "suiting up" in clean room suits prior to entry.

In other embodiments, the apparatus 100 can have other positional arrangements that also reduce the effective footprint of the apparatus 100. For example, the apparatus 100 can be moved rearwardly through the aperture 123 into the gray room environment 121 with at least a portion of (and optionally, the entirety of) the side surfaces 103c received in the gray room environment 121. Accordingly, the amount of clean room floor space required by the apparatus 100 can be less than for other tools having a similar number of processing stations.

In one aspect of the foregoing embodiments, the side surfaces 103c need not be accessible to operate or service the apparatus 100. Accordingly, the side surfaces 103c need not include access panels configured for regular access. Alternatively, the apparatus 100 can be configured to be placed end-to-end with another processing tool, and at least one of the side surfaces 103c can have an opening configured to allow the microelectronic workpieces 114 to be automatically transferred from the apparatus 100 to the adjoining processing tool.

Figure 2:
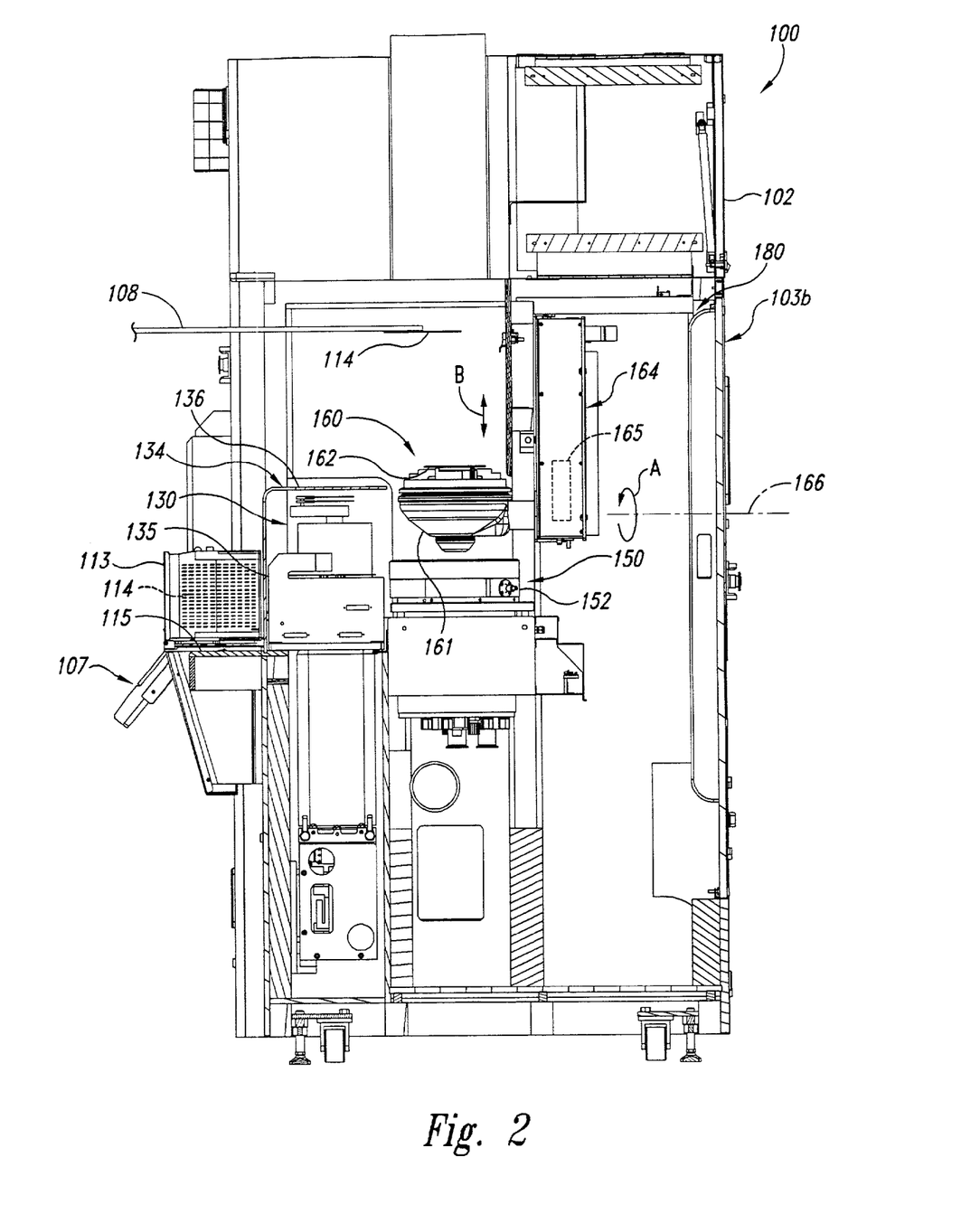
FIG. 2 is a partially schematic, cross-sectional side view of an apparatus generally similar to that shown in FIG. 1 with a support positioned to manually receive a microelectronic workpiece in accordance with an embodiment of the invention.

FIG. 2 is a cross-sectional side view of the apparatus 100 described above with reference to FIG. 1 in accordance with an embodiment of the invention. In one aspect of this embodiment, at least one of the processing stations 150 can include a vessel 152 configured to provide a processing fluid, such as an electrolytic or electroless processing fluid for metal deposition. A support 160 can be positioned proximate to the vessel 152 and can be configured to receive single microelectronic workpieces 114 and carry the microelectronic workpieces 114 in contact with the processing fluid. Alternatively, the support 160 can be configured to simultaneously carry a plurality of microelectronic workpieces 114. In still further embodiments, the processing station 150 can have other configurations and can carry out other functions, such as rinsing, drying, etching, spraying, measuring, annealing or coating the microelectronic workpieces 114. Further details of stations that perform such functions are included in U.S. patent application Ser. No. 10/080,715, previously incorporated herein by reference. Other arrangements for processing stations 150 and supports 160 are included in U.S. Pat. Nos. 6,136,163 and 6,139,712, both incorporated herein by reference. In some of the foregoing embodiments, the processing stations 150 do not include vessels, and accordingly, the support 160 can carry the microelectronic workpiece 114 relative to other portions of the processing stations 150.

In one embodiment, the support 160 can include a head 161 having a receiving surface 162 (such as an annular ring) positioned to receive the microelectronic workpiece 114. The head 161 can be supported by a carrier 164 and can rotate relative to the carrier 164 about a head rotation axis 166 (as indicated by arrow A) between a manual transfer position (shown in FIG. 2) and a process position. In the manual transfer position, the receiving surface 162 can face upwardly to allow a user to manually place the microelectronic workpiece 114 on the head 161, or remove the microelectronic workpiece 114 from the head 161. For example, the user can manipulate a wand 108 having a vacuum end effector to place and remove the microelectronic workpiece 114. In other embodiments, the user can place and remove the microelectronic workpiece 114 directly by hand or the user can operate other manual implements. In any of these embodiments, the head 161 can rotate 180 degrees about the head rotation axis 166 from the manual transfer position to the process position, and can be lowered into the vessel 152 for processing the microelectronic workpiece 114.

In a further aspect of this embodiment, the support 160 can include a support holder 180 that supports the carrier 164 from a position located above the processing station 150. In one embodiment, the carrier 164 can be movable relative to the support holder 180, as described in greater detail below with reference to FIG. 6. In another embodiment, the carrier 164 can be fixedly supported from above. In either embodiment, the carrier 164 can include an elevator 165 that moves the head 161 upwardly and downwardly as indicated by arrow B. Accordingly, the head 161 can move along a guide path upwardly to the manual transfer position, then rotationally and downwardly to the process position.

In another aspect of this embodiment, the shield 134 can extend proximate to the support 160 to at least restrict contact between the user and the transfer device 130 while the user manually accesses the head 161. For example, the shield 134 can include an upright portion 135 that extends upwardly to a position above the transfer device 130. The shield 134 can further include a transverse portion 136 that extends transversely over the transfer device 130 toward the support 160. Accordingly, the shield 134 can at least restrict the user's access to the transfer device 130, while allowing the user to access the head 161 when the head 161 is in the manual transfer position. In a further aspect of this embodiment, the shield 134 can be transparent to allow observation of the transfer device 130.

In operation, the user can place a container 113 on the support surface 115 adjacent to the upright portion 135 of the shield 134. The user can then remove one of the microelectronic workpieces 114 from the container 113 in preparation for transferring the microelectronic workpiece 114 to the support 160. The support 160 can move upwardly to the manual transfer position. In one aspect of this embodiment, the head 161 of the support 160 can move upwardly until the receiving surface 162 is at or above the elevation of the transverse portion 136 of the shield 134. The user can then reach over the shield 134 to load (or unload) the microelectronic workpiece 114 while the shield 134 protects the user from inadvertent contact with the transfer device 130. In one aspect of this embodiment, if the transfer device 130 attempts to access the support 160 while the support 160 is in the manual transfer position, the head 161 will interfere with the motion of the transfer device 130, providing additional protection for the user accessing the support 160 manually.

In one aspect of this embodiment, the user can alternate between dedicating the apparatus 100 to manual processing and dedicating the apparatus 100 to automatic processing. Alternatively, the apparatus 100 can automatically process some microelectronic workpieces 114 in one or more of the processing stations 150 while the user simultaneously processes other microelectronic workpieces 114 manually in processing stations not concurrently occupied by automatically processed microelectronic workpieces 114. In either embodiment, the user can enter the appropriate commands at the user interface 107 to allow manual operation and/or initiate and direct automatic operation. In either embodiment, the same apparatus 100 can automatically process microelectronic workpieces 114 in a manner described below with reference to FIG. 3.

Figure 3:
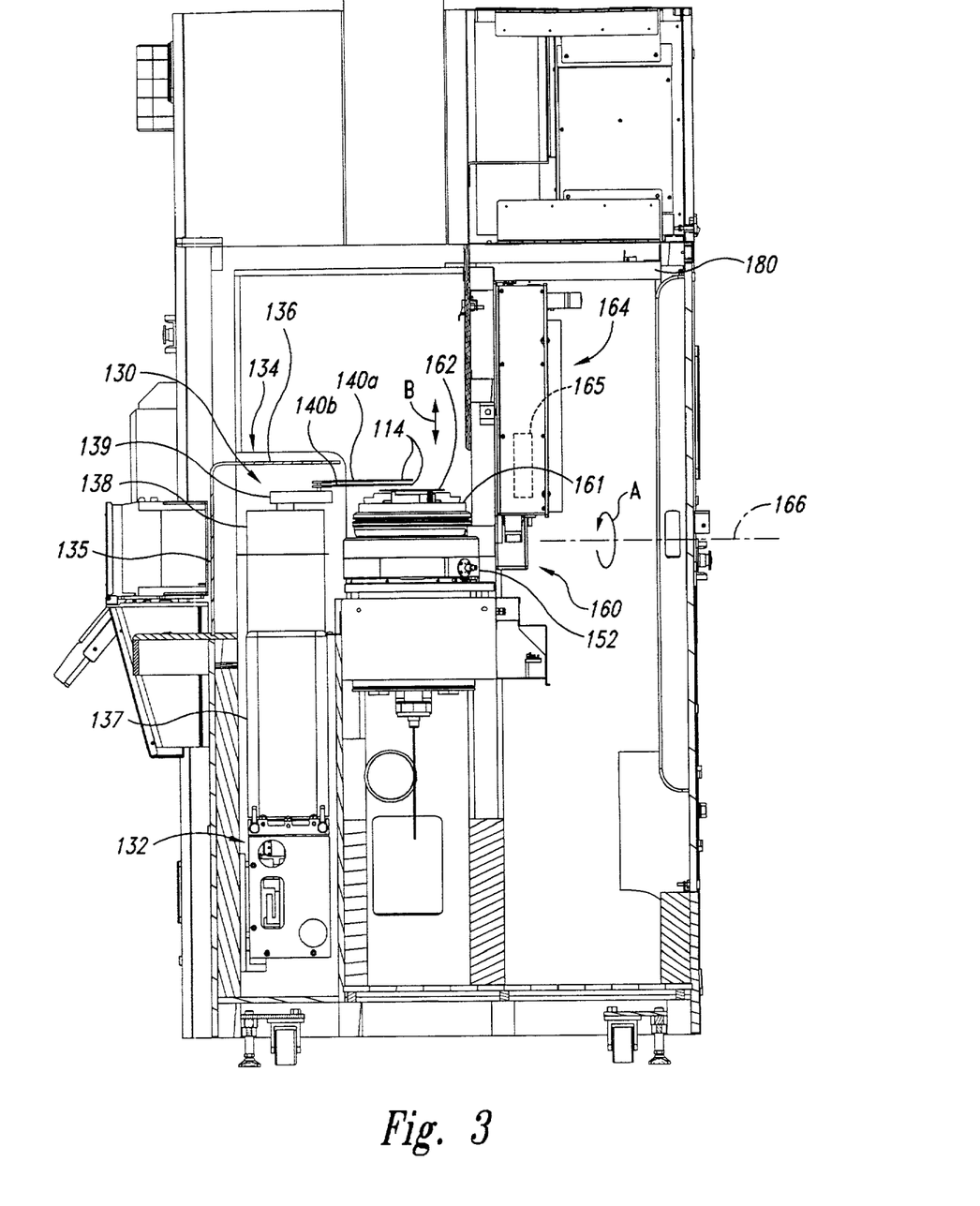
FIG. 3 is a partially schematic, cross-sectional side view of an apparatus generally similar to that shown in FIGS. 1 and 2 with the support positioned to receive microelectronic workpieces from an automated transfer device in accordance with an embodiment of the invention.

FIG. 3 is a cross-sectional side view of the apparatus 100 described above with reference to FIGS. 1 and 2 showing the support 160 located in an automatic transfer position to transfer the microelectronic workpiece 114 to and/or from the transfer device 130. In one aspect of this embodiment, the automatic transfer position can be located in a plane beneath the plane of the manual transfer position (FIG. 2) and beneath the transverse portion 136 of the shield 134. Accordingly, the transfer device 130 can access the receiving surface 162 of the head 161. The transfer device 130 can include a base 137 supported by the transfer device support 132 for movement transverse to the plane of FIG. 3. The base 137 can support a lift 138 connected to an arm 139 to move the arm 139 upwardly and downwardly relative to the base 137. Two end effectors 140 (shown as an upper end effector 140a and a lower end effector 140b) can be pivotally attached to the arm 139 to rotate relative to the arm 139, as described in greater detail below with reference to FIG. 4. Each end effector 140 can carry a microelectronic workpiece 114, for example, with a vacuum grip or another releasable gripping mechanism, and can move toward and away from the head 161.

During automatic operation, the elevator 165 of the support 160 can move the head 161 to the automatic transfer position to receive a microelectronic workpiece 114 from the transfer device 130. After the transfer device 130 places the microelectronic workpiece 114 on the receiving surface 162 of the head 161, the elevator 165 can elevate the head 161 slightly to provide vertical clearance between the head 161 and the vessel 152. The head 161 can then rotate 180 degrees about the head rotation axis 166 (as described above with reference to FIG. 2) and the elevator 165 can lower the head 161 to the process position. The foregoing steps can be reversed after processing to remove the microelectronic workpiece 114 from the head 161.

One feature of the foregoing embodiments described above with reference to FIGS. 1–3 is that the support 160 can selectively stop at two different positions for receiving the microelectronic workpiece 114: a manual transfer position for manually placing and removing the microelectronic workpieces, and an automatic transfer position for automatically placing and removing the microelectronic workpieces 114. The use of different positions for manually and automatically transferring the microelectronic workpieces 114 can provide several advantages. For example, when the support 160 is in the manual transfer position, the user can be shielded from contact with the automatic transfer device 130, and when the support 160 is in the automatic transfer position, the transfer device 130 can access the support 160. The different positions can also provide a visual cue to the user to indicate to the user when it is appropriate to manually access the support 160. For example, in one embodiment, the user can see that when the head 161 is positioned above the transverse portion 136 of the shield 134, the receiving surface 162 is accessible for manual loading and/or unloading. Conversely, when the head 161 is positioned below the transverse portion 136 of the shield 134, the user can see that the head is positioned for automatic transfer and is not available for manually receiving or discharging the microelectronic workpiece 114.

In one embodiment, the support 160 can move upwardly and downwardly between the manual transfer position and the automatic transfer position, and can rotate between the transfer positions and the process position. In other embodiments, the support 160 can move along different axes and/or in different manners between any of these three positions. In still a further embodiment, the manual transfer position and the automatic transfer position can be identical. In one aspect of this embodiment, the user can be protected from inadvertent contact with the transfer device 130 by other arrangements, for example, a moving shield 134.

Figure 4:
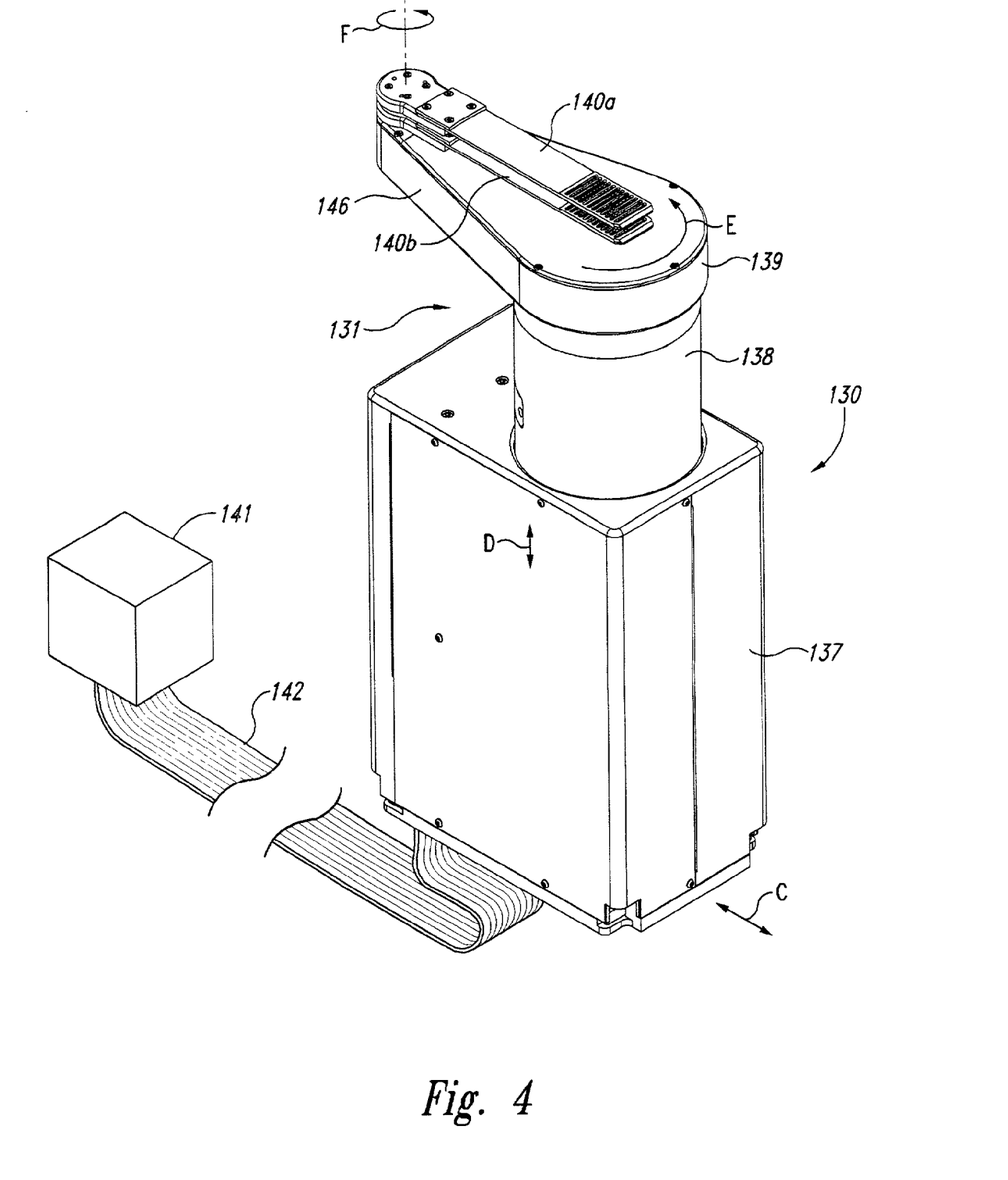
FIG. 4 is an isometric view of a portion of an automated transfer device in accordance with an embodiment of the invention.

FIG. 4 is an isometric view of a transfer device 130 in accordance with an embodiment of the invention. In one aspect of this embodiment, the transfer device 130 can include a robot 131 supported by the transfer device support 132 (FIG. 3) to move linearly as indicated by arrow C. Accordingly, the robot 131 can be automatically moved into alignment with the input/output station 110 (FIG. 1) and any of the processing stations 150 (FIG. 1). The base 137 of the transfer device 130 can support the lift 138 for upward and downward motion, as indicated by arrow D. The lift 138 can support the arm 139 for rotational motion, as indicated by arrow E. In one embodiment, the arm 139 can have a single eccentric projection 146 that extends away from the axis along which the lift 138 moves, and that supports the end effectors 140. Alternatively, the arm 139 can have multiple projections. The single eccentric projection 146 can be less likely than multiple projection arrangements to interfere with surrounding components when the arm 139 rotates. In either embodiment, the end effectors 140 can rotate independently relative to the arm 139 about a common axis, as indicated by arrow F.

In one aspect of this embodiment, the robot 131 can be coupled to a control unit 141 with a flexible cable 142 (such as a ribbon cable). The robot can move linearly as indicated by arrow C without restriction from the cable 142. In a further aspect of this embodiment a significant portion of the control and power circuitry required to operate the robot 131 can be positioned in the control unit 141 rather than on the robot 131 itself. An advantage of this arrangement is that the robot 131 can be made smaller and can accordingly require less space in which to move.

Figure 5:
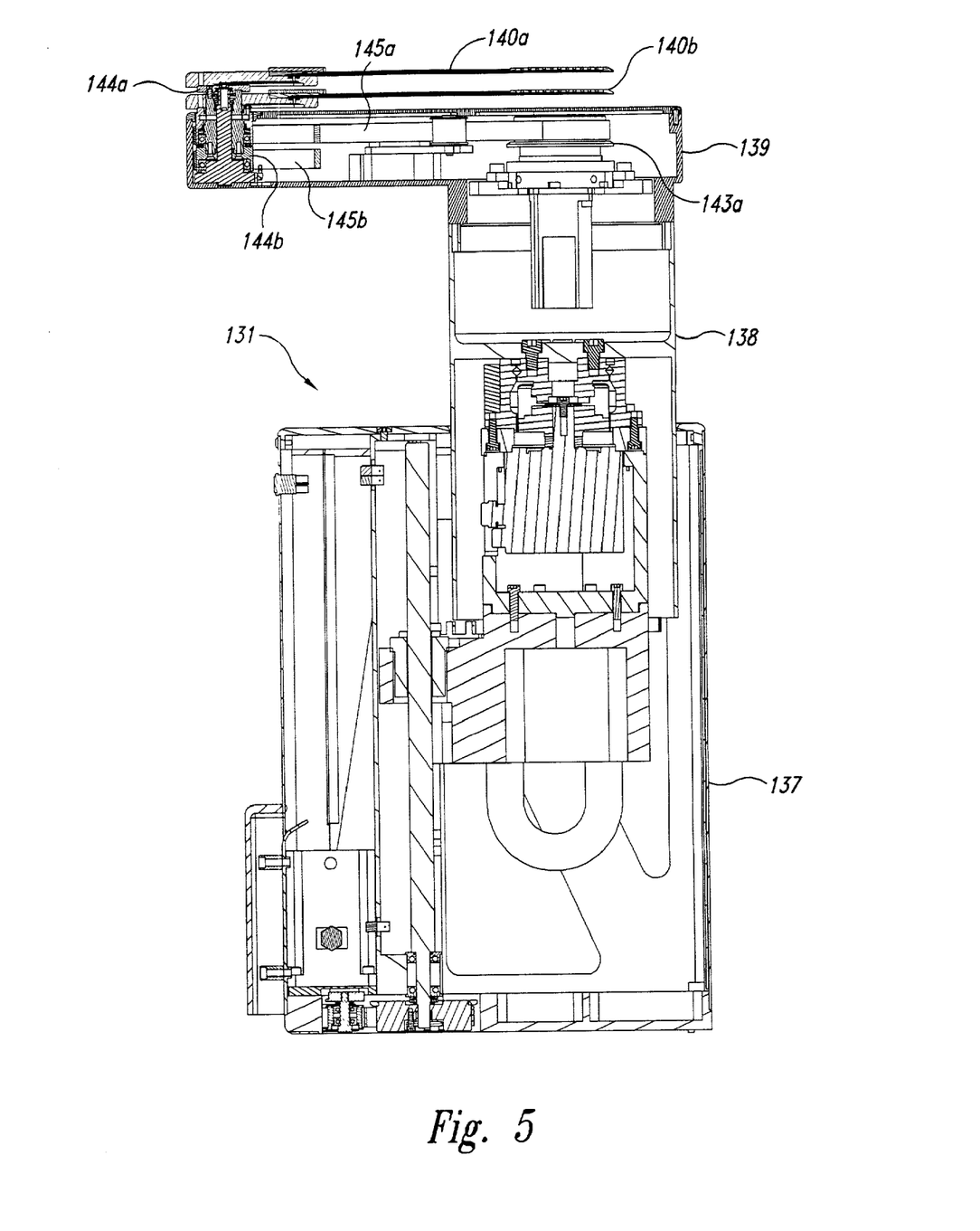
FIG. 5 is a partially schematic, cross-sectional side view of the automated transfer device shown in FIG. 4 taken substantially along line 5—5.

FIG. 5 is a partially schematic, cross-sectional side view of the robot 131 in accordance with an embodiment of the invention. In one aspect of this embodiment, the upper end effector 140a is supported on an inner shaft 144a and the lower end effector 140b is supported on an outer shaft 144b disposed outwardly from the inner shaft 144a. The outer shaft 144b can be driven by an outer shaft belt 145b (extending out of the plane of FIG. 5) which can in turn be driven by an outer shaft pulley (not visible in FIG. 5). The inner shaft 144a can be coupled to an inner shaft belt 145a which can in turn be powered by an inner shaft pulley 143a. Because the upper end effector 140a is vertically spaced apart from the lower end effector 140b, each end effector 140 can move without interfering with the movement of the other. By providing independent power transmission to each end effector 140, each end effector 140 can move independently of the other. For example, one of the end effectors 140 can position a microelectronic workpiece 114 on the support 160 (FIG. 3) while the other end effector 140 retains a microelectronic workpiece 114 for delivery to a different support 160 or to the input/output device 110 (FIG. 1).

In other embodiments, the transfer device 130 can have other configurations. For example, the transfer device 130 can carry a single microelectronic workpiece 114 or more than two microelectronic workpieces 114. When the transfer device 130 carries more than one microelectronic workpiece 114, the motion of each microelectronic workpiece 114 can be at least partially independent, as described above with reference to FIGS. 4 and 5. Alternatively, the transfer device 130 can be configured to automatically move a plurality of microelectronic substrates 114 together in a batch arrangement, for example, with or without a separate carrier or container configured for use within the enclosure 102. Further details of aspects of transfer devices in accordance with other embodiments of the invention are included in U.S. patent application Ser. No. 09/875,300, filed Jun. 5, 2001,U.S. patent application Ser. No. 10/080,910, and published PCT Application No. PCT/US99/14414, all incorporated herein by reference.

Figure 6:
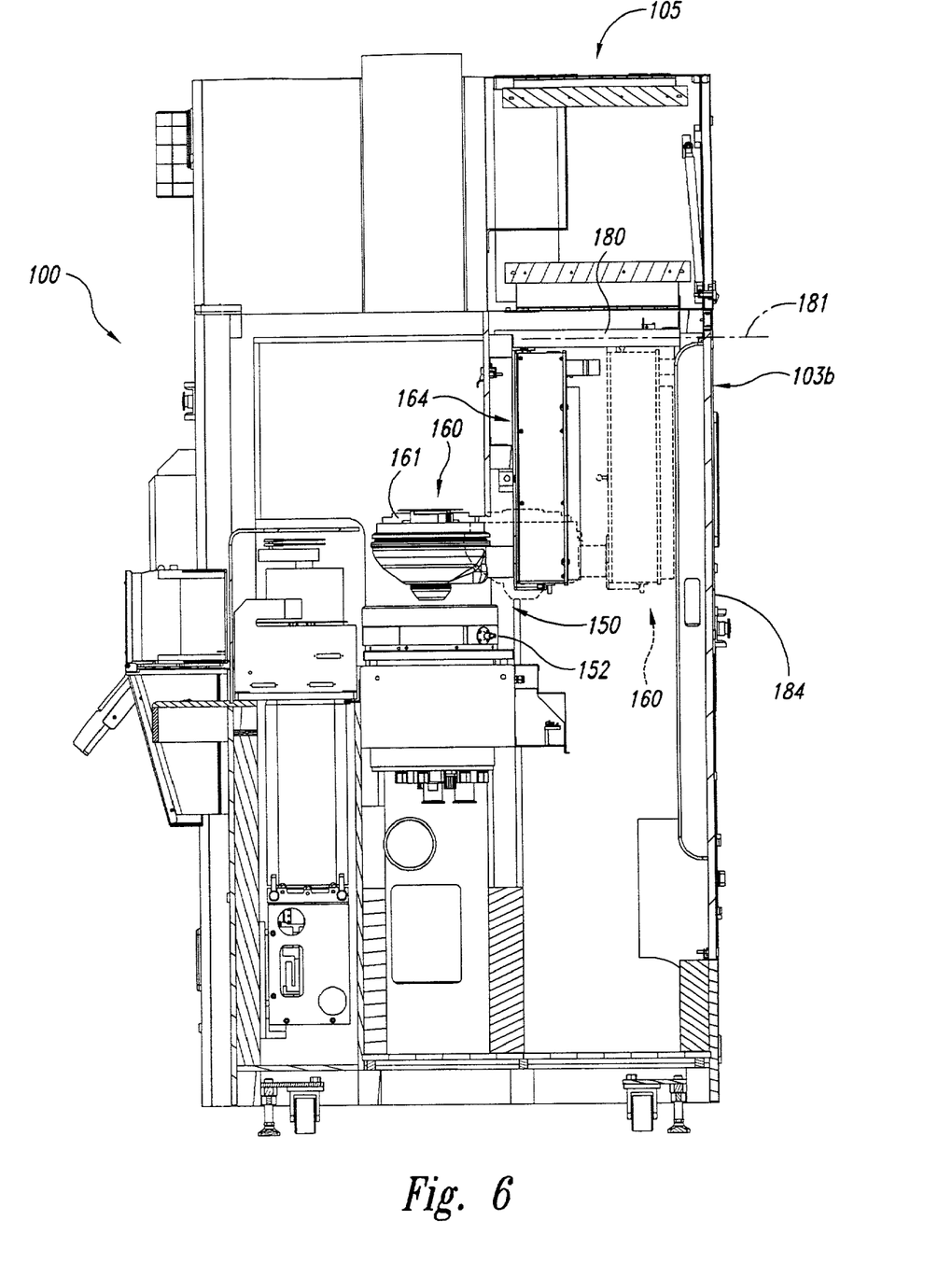
FIG. 6 is a partially schematic, cross-sectional side view of an apparatus generally similar to that shown in FIG. 1 with the support movable toward and away from a processing station in accordance with an embodiment of the invention.

FIG. 6 is a cross-sectional side view of the apparatus 100 with the support 160 arranged to be movable relative to the support holder 180 in accordance with an embodiment of the invention. As shown in FIG. 6, the carrier 164 of the support 160 can be suspended from the support holder 180, with the support holder 180 positioned above the head 161 and the vessel 152 of the processing station 150. The support holder 180 can include a support guide path 181 along which the support 160 can move between an operational position (shown in solid lines in FIG. 6) and an access position (shown in phantom lines in FIG. 6). In the operational position, the head 161 can be positioned to have microelectronic workpieces 114 automatically or manually transferred to it or from it, as described above. In the access position, the head 161 can be moved transversely away from the processing station 150 to allow access to the vessel 152. Accordingly, the user can access the vessel 152 from the front surface 103a of the enclosure 102 (for example, for maintenance) while the support 160 is in the access position.

In one aspect of this embodiment, the support guide path 181 can be generally straight and transverse to the vertical motion of the head 161 as it moves relative to the vessel 152. In other embodiments, the support guide path 181 can have other configurations. For example, in one alternate embodiment, the support guide path 181 can be curved.

In a further aspect of the embodiment shown in FIG. 6, the entire support 160 can be disconnected from the apparatus 100 and removed through the rear surface 103b of the enclosure 102 by moving and/or removing an access panel 184 at the rear surface 103b. Accordingly, the support 160 can be serviced remotely from the apparatus 100, and the user can have additional access to the chamber 150 and the vessel 152 through the rear surface 103b of the enclosure 102. In one aspect of this embodiment, the support holder 180 can include an arrangement of rails for linear movement of the support 160, as described in greater detail below with reference to FIGS. 7 and 8. In other embodiments, the support holder 180 can have other configurations for moving the support 160 relative to the chamber 150 and/or relative to the apparatus 100. For example, in other embodiments, the support 160 can pivot about one or more axes to allow access to the chamber 150.

Figure 7:
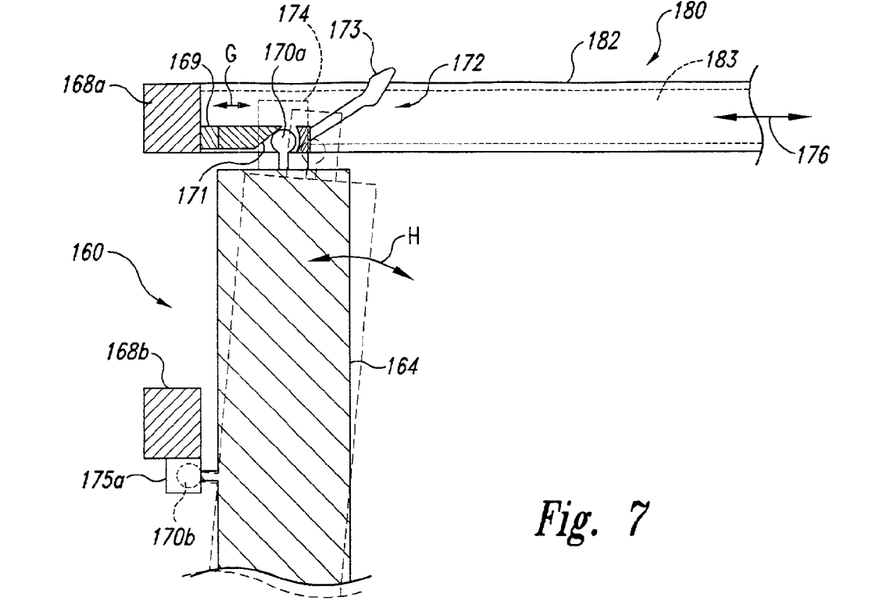
FIG. 7 is a partially schematic, cross-sectional side view of a portion of a support carried by a support holder in accordance with an embodiment of the invention.
Figure 8:
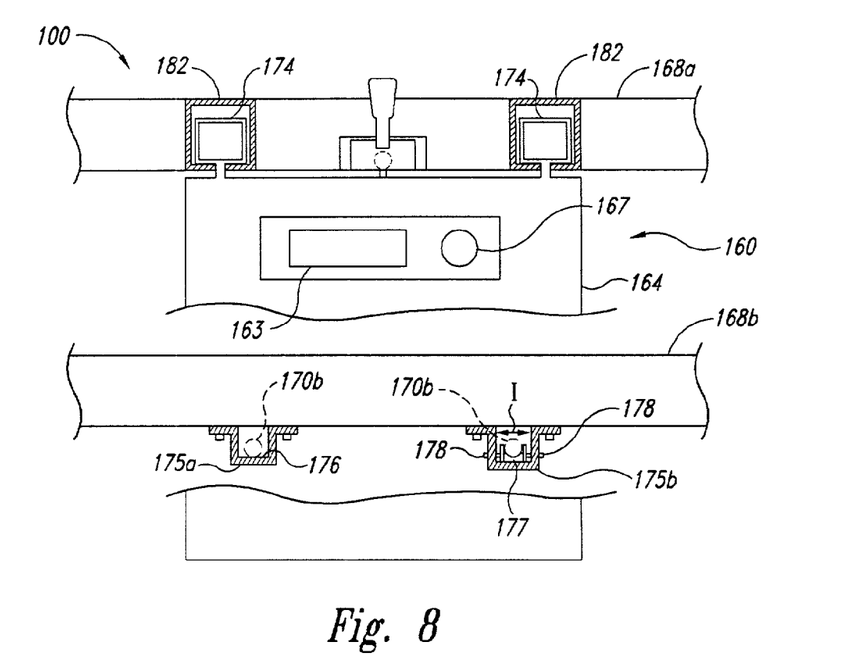
FIG. 8 is a partially schematic rear view of a portion of the support shown in FIG. 7 carried by the support holder in accordance with an embodiment of the invention.

FIGS. 7 and 8 are partially schematic illustrations of a support 160 configured for installation and removal in accordance with an embodiment of the invention. Referring first to FIG. 7, the support holder 180 can include a pair of guide rails 182 (one of which is visible in FIG. 7), each having a linear channel 183 aligned along the support guide path 181. The carrier 164 of the support 160 can include guide members 174 slidably received in the channels 183. Accordingly, the carrier 164 can be suspended or at least partially suspended from the guide rails 182.

In a further aspect of this embodiment, the carrier 164 can include features that allow it to be aligned and positioned within the apparatus 100. For example, the carrier 164 can include a plurality of locator balls 170, shown as an upper locator ball 170a and a pair of lower locator balls 170b (one of which is visible in FIG. 7). The apparatus 100 can include corresponding features positioned to receive and align the locator balls 170. For example, the apparatus 100 can include an upper support beam 168a having an upper support bracket 169 configured to receive the upper locator ball 170a. The apparatus 100 can further include a lower support beam 168b having two lower support brackets 175, including a left lower support bracket 175a and a right lower support bracket 175b (not visible in FIG. 7), positioned to receive the lower locator balls 170b.

In one embodiment, the upper support bracket 169 can have a positioning surface 171 arranged to contact the upper locator ball 170a. The upper support bracket 169 can be adjustable forward and aft, as indicated by arrow G. Upon installation, the forward and aft position of the upper support bracket 169 can be adjusted until the carrier 164 is vertically aligned. Once the carrier 164 is properly aligned, a locking mechanism 172 having a latch 173 can be actuated to secure the upper locator ball 170a against the positioning surface 171. To move or remove the carrier 164, the locking mechanism 172 is released, allowing the carrier 164 to pivot rearwardly about the lower locator ball 170b, as indicated by arrow H and as shown in dashed lines in FIG. 7. After the carrier 164 has pivoted rearwardly as shown in FIG. 7, the lower locator balls 170b can be removed from the lower support brackets 175 and the carrier 164 can be moved further aft to the access position, and/or removed from the apparatus 100, as described above with reference to FIG. 6.

FIG. 8 is a partially schematic, partially broken rear view of a portion of the support 160 supported in the apparatus 100 at least in part by the guide members 174. In one aspect of this embodiment, the guide members 174 can be slidably received in the guide rails 182. In an alternate embodiment, the guide members 174 can include wheels that roll along the guide rail 182, and in other embodiments, the apparatus 100 can include other arrangements that allow for relative movement between the support 160 and the support holder 180. In any of these embodiments, the support carrier 164 can include an electrical terminal 163 configured to releasably receive an electrical cable (not shown) and a pneumatic terminal 167 configured to releasably receive a pneumatic conduit (not shown). The electrical cable and the pneumatic conduit can be detached from the carrier 164 prior to removing the support 160 from the apparatus 100.

In one aspect of an embodiment of apparatus 100 shown in FIG. 8, the lower support brackets 175 (shown as the left lower support bracket 175a and the right lower support bracket 175b) can be configured to accommodate transverse alignment of the carrier 164. For example, the left support bracket 175a can include a generally flat receiving surface 176 along which a corresponding one of the lower locator balls 170b can slide. The right support bracket 175b can include a receiving cradle 177 configured to receive the other lower locator ball 170b and at least restrict movement of the other lower locator ball 170b to provide additional support for the carrier 164. Accordingly, the receiving cradle 177 can be adjusted laterally as indicated by arrow I using adjustment screws 178.

One feature of an embodiment of the apparatus 100 described above with reference to FIGS. 6–8 is that the support 160 can be supported by a support holder 180 that allows for movement of the support 160 while the weight of the support 160 is still borne by the apparatus 100. Accordingly, it can be easier to reposition the support 160 while accessing the processing station 150 below. Another advantage of this feature is that it can be easier to remove the support entirely from the apparatus 100 through the rear surface 103b of the apparatus 100.

Another feature of an embodiment of the support 160 is that it is carried from a position located above the processing station 150. One advantage of this feature is that the support 160 need not occupy space below the head 161 and adjacent to the processing station 150. Instead, this space can be left free (for example, to access the processing station 150) or can be occupied by additional support equipment for the processing station 150. Another advantage of this arrangement is that the electrical cable between the support 160 and the electrical units 105 that provide power and control signals to the support 160 can be shorter because the support 160 is positioned closer to the electrical units 105. Still another advantage of this arrangement is that the electrical cable can be positioned entirely above the processing station 150 when it is coupled to the support carrier 164. Accordingly, the likelihood for contact between the electrical cable and the chemicals contained in the processing station 150 can be reduced and/or eliminated.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. An apparatus for processing microelectronic workpieces, comprising;
 a plurality of processing stations;
 an enclosure disposed proximate to at least one of the processing stations, the enclosure having an access aperture positioned to allow manual access to all the processing stations from a single side of the apparatus during operation;
 an input/output station configured to support at least one microelectronic workpiece for automatic transfer to and from the processing stations; and
 a transfer device positioned proximate to the input/output station and the processing stations, the transfer device being automatically movable to transfer microelectronic workpieces between the input/output station and the processing stations;
 wherein at least one of the processing stations includes:
  a processing vessel configured to provide a processing fluid; and
  a support movably positioned proximate to the processing vessel and configured to carry the microelectronic workpiece, the support being moveable between a process position, a first transferring position spaced apart from the process position and a second transferring position spaced apart from the process position and the first transferring position, wherein the support is oriented to carry the microelectronic workpiece in contact with a processing fluid when the processing fluid is in the vessel and the support is in the process position, the support being oriented to receive the microelectronic workpiece from the transfer device when the support is in the first transferring position, and the support being positioned to receive the microelectronic workpiece manually from the user when the support is in the second transferring position, the support being configured to selectively stop its motion at the first and second transferring positions.

2. The apparatus of claim 1, further comprising a shield positioned at least proximate to the transfer device to at least restrict access by the user to the transfer device.

3. The apparatus of claim 1 wherein the transfer device is configured to carry and independently move two microelectronic workpieces.

4. The apparatus of claim 1 wherein the input/output station is configured to support a container carrying a plurality of microelectronic workpieces, with the container being accessible to the transfer device when the container is supported at the input/output station.

5. The apparatus of claim 1 wherein the processing stations are aligned along a generally straight first line and wherein the transfer device includes a robot configured to move along a second line generally parallel to the first line.

6. The apparatus of claim 1 further comprising a shelf carried by the enclosure and positioned to support a container a microelectronic workpieces while the user manually removes the microelectronic workpieces from the container and transfers the microelectronic workpieces to at least one of the processing stations.

7. The apparatus of claim 1 wherein the processing stations are arranged along a generally straight first line and wherein the transfer device includes a robot configured to move along a second line generally parallel to the first line, the second line being positioned between the first line and the access aperture.

8. The apparatus of claim 1 wherein the transfer device includes:
  a transfer device support having a guide path;
  a base carried by the transfer device support and movable along the guide path;
  a lift carried by the base and movable upwardly and downwardly along a lift axis;
  an arm carried by the lift, the arm being rotatable relative to the base, the arm having an extension portion projecting away from the lift axis; and
  first and second end effectors carried by the arm and rotatably coupled to the extension portion of the arm, with each end effector being independently rotatable relative to the arm and each end effector being configured to releasably carry a microelectronic workpiece.

9. The apparatus of claim 1 wherein the support includes a carrier extending upwardly from the at least one processing station, an elevator supported by the carrier and movable toward and away from the at least one processing station, and a head carried by the elevator, the head having a receiving portion configured to releasably receive the microelectronic workpiece, the head being rotatable relative to the carrier and the at least one processing station.

10. The apparatus of claim 1 wherein the support is inaccessible to the automatic transfer device when the support is in the second transferring position.

11. The apparatus of claim 1 wherein the support is a first distance from the at least one processing station when in the first transferring position, the support being a second distance from the at least one processing station when in the second transferring position, the second distance being greater than the first distance.

12. The apparatus of claim 1 wherein the support includes a carrier extending upwardly from the processing vessel, an elevator supported by the carrier and movable toward and away from the at least one processing station, and a head carried by the elevator, the head having a receiving portion configured to releasably receive the microelectronic workpiece.

13. The apparatus of claim 1 wherein the support includes a carrier extending upwardly from the at least one processing station, the carrier having an elevator supported by the carrier and movable toward and away from the at least one processing station, and a head carried by the elevator, the head having a receiving portion configured to releasably receive the microelectronic workpiece, and wherein the carrier is carried by a guide device positioned above the at least one processing station, the guide device having a guide path, the carrier being movable toward and away from the at least one processing station along the guide path.

14. The apparatus of claim 1, further comprising a track positioned above the at least one processing station, wherein the support is at least partially suspended from the track and is movable along the track toward and away from the at least one processing station.

15. The apparatus of claim 1, further comprising:
  a track positioned above the at least one processing station, wherein the support is at least partially suspended from the track and is movable along the track toward and away from the at least one processing station; and
  a releasable locking mechanism engagable with the support to at least restrict motion of the support along the track.

* * * * *

UNITED STATES PATENT AND TRADEMARK OFFICE
CERTIFICATE OF CORRECTION

PATENT NO. : 6,991,710 B2 Page 1 of 1
DATED : January 31, 2006
INVENTOR(S) : Randy Harris It is certified that error appears in the above-identified patent and that said Letters Patent is hereby corrected as shown below:

<u>Column 13,</u>
Line 24, "container a microelectronic" should be -- container of microelectronic --.

Signed and Sealed this

Thirteenth Day of June, 2006

JON W. DUDAS
*Director of the United States Patent and Trademark Office*